United States Patent
Sato

(10) Patent No.: US 10,571,524 B2
(45) Date of Patent: Feb. 25, 2020

(54) IN-VEHICLE POWER SUPPLY DEVICE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Shinichiro Sato, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 33 days.

(21) Appl. No.: 15/767,224

(22) PCT Filed: Sep. 5, 2016

(86) PCT No.: PCT/JP2016/075965
§ 371 (c)(1),
(2) Date: Apr. 10, 2018

(87) PCT Pub. No.: WO2017/068874
PCT Pub. Date: Apr. 27, 2017

(65) Prior Publication Data
US 2019/0072617 A1 Mar. 7, 2019

(30) Foreign Application Priority Data
Oct. 22, 2015 (JP) .................... 2015-208020

(51) Int. Cl.
*H02J 7/00* (2006.01)
*G01R 31/392* (2019.01)
(Continued)

(52) U.S. Cl.
CPC ............ *G01R 31/392* (2019.01); *B60L 58/12* (2019.02); *B60L 58/16* (2019.02); *B60L 58/20* (2019.02);
(Continued)

(58) Field of Classification Search
USPC ........................................................ 320/121
See application file for complete search history.

(56) References Cited

U.S. PATENT DOCUMENTS

2009/0130538 A1* 5/2009 Kaita .................... B60L 3/0046
429/50
2012/0306266 A1* 12/2012 Ohnuki ................... B60L 8/003
307/9.1
(Continued)

FOREIGN PATENT DOCUMENTS

| JP | 2000-002758 A | 1/2000 |
| JP | 2010-232106 A | 10/2010 |
| JP | 2014-155327 A | 8/2014 |

OTHER PUBLICATIONS

Search Report for PCT/JP2016/075965, dated Nov. 8, 2016.

*Primary Examiner* — Arun C Williams
(74) *Attorney, Agent, or Firm* — Honigman LLP

(57) ABSTRACT

Provided is a power supply device for a vehicle in which charge movement between a plurality of cell groups can be suppressed. The plurality of cell groups each include a plurality of cells connected in series to each other and are each provided on one of the plurality of wiring paths. A plurality of switches are connected in series to the plurality of cell groups in the plurality of wiring paths. A deterioration diagnosis unit specifies, from the plurality of cell groups, a deteriorated cell group that has deteriorated. A switch controller turns off, among the plurality of switches, a deteriorated switch that is connected to the deteriorated cell group.

6 Claims, 4 Drawing Sheets

Legend
A= Generator
B= Vehicle load
C= Deteriorated diagnosis unit
D= Remaining amount detection unit
E= Switch controller

(51) Int. Cl.
*H02J 7/14* (2006.01)
*H01M 10/48* (2006.01)
*B60L 58/22* (2019.01)
*B60L 58/12* (2019.01)
*B60L 58/20* (2019.01)
*B60L 58/16* (2019.01)
*G01R 31/389* (2019.01)
*G01R 31/3828* (2019.01)
*H01M 10/44* (2006.01)

(52) U.S. Cl.
CPC ............ *B60L 58/22* (2019.02); *G01R 31/389* (2019.01); *H01M 10/482* (2013.01); *H02J 7/0019* (2013.01); *H02J 7/0021* (2013.01); *H02J 7/0026* (2013.01); *H02J 7/1423* (2013.01); *B60L 2240/547* (2013.01); *B60L 2240/549* (2013.01); *G01R 31/3828* (2019.01); *H01M 10/441* (2013.01); *H01M 2220/20* (2013.01)

(56) References Cited

U.S. PATENT DOCUMENTS

| | | | |
|---|---|---|---|
| 2013/0062941 A1* | 3/2013 | Yamamoto | B60K 6/445 307/10.6 |
| 2013/0088201 A1 | 4/2013 | Iwasawa et al. | |
| 2014/0042973 A1* | 2/2014 | Kawahara | H01M 10/441 320/118 |
| 2014/0077771 A1 | 3/2014 | Yamashita et al. | |
| 2015/0349387 A1* | 12/2015 | Inaba | H01M 10/44 700/297 |

* cited by examiner

Legend
A= Generator
B= Vehicle load
C= Deteriorated diagnosis unit
D= Remaining amount detection unit
E= Switch controller Legend
A= Generator
B= Vehicle load
C= Deterioration diagnosis unit
D= Remaining amount detection unit
E= Switch controller

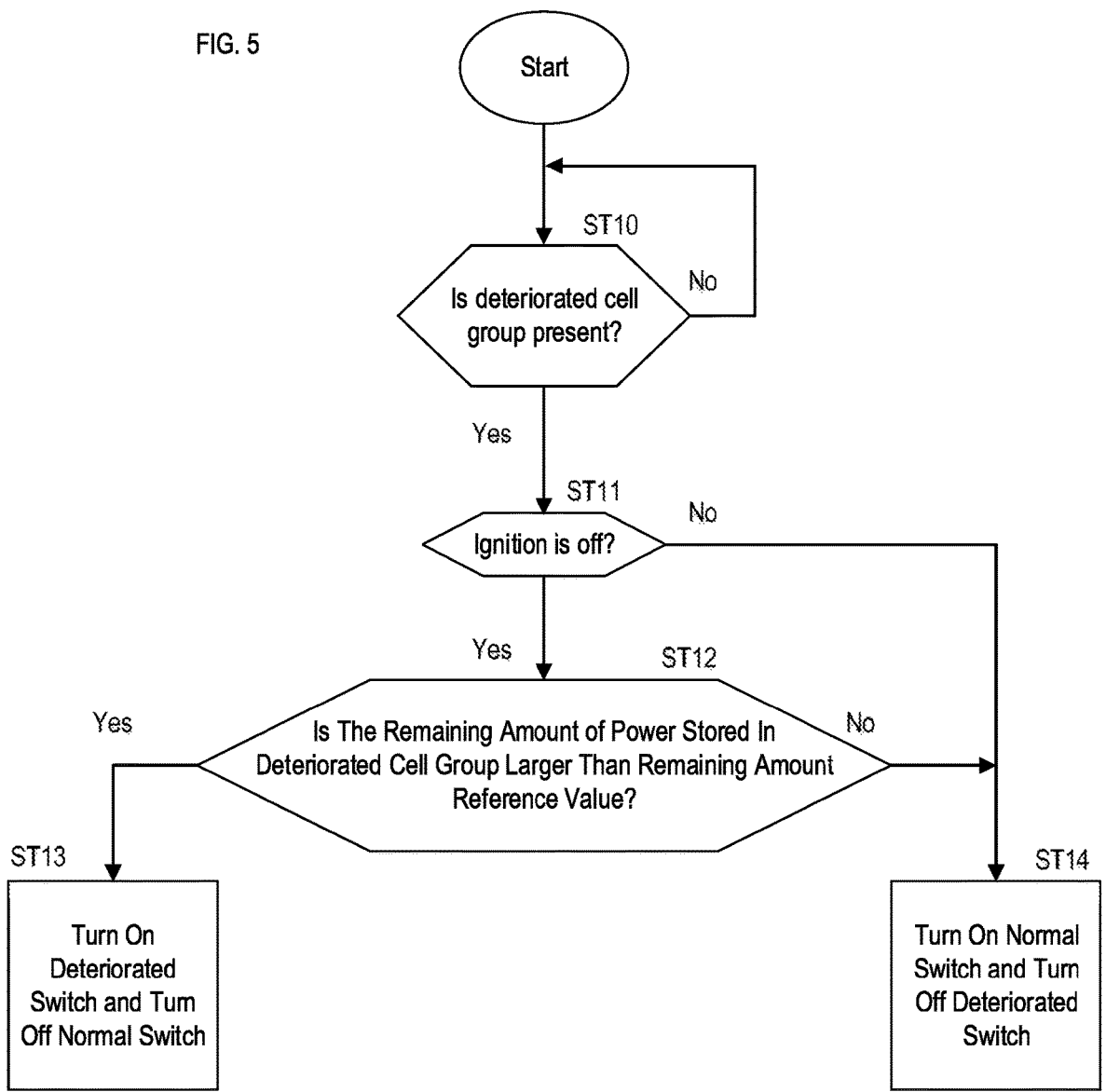

IN-VEHICLE POWER SUPPLY DEVICE

CROSS-REFERENCE TO RELATED APPLICATIONS

This application is the U.S. national stage of PCT/JP2016/075965 filed Sep. 5, 2016, which claims priority of Japanese Patent Application No. JP 2015-208020 filed Oct. 22, 2015.

TECHNICAL FIELD

The present invention relates to an in-vehicle power supply device.

BACKGROUND

JP 2013-42647A discloses a plurality of secondary battery cells. The plurality of secondary battery cells are installed in a vehicle. Also, the plurality of secondary battery cells are connected in series to each other, are charged by a generator, for example, and supply power to the vehicle load. The generator generates power and outputs a direct voltage. In JP 2013-42647A, a first switch is provided between a high-potential terminal of each of the secondary battery cells and a high-potential terminal of the generator, and a second switch is provided between a low-potential terminal of each of the secondary battery cells and a low-potential terminal of the generator.

In JP 2013-42647A, the secondary battery cells are individually charged by controlling these first and second switches using the generator. For example, a first secondary battery cell is charged by turning on the first switch and the second switch that are connected to the first secondary battery cell. Next, these first and second switches are turned off, and the first switch and the second switch that are connected to a second secondary battery cell are turned on. Accordingly, the second secondary battery cell is charged. Similarly, the secondary battery cells can be individually and evenly charged by sequentially controlling the first switches and the second switches. Note that Patent Documents 2 and 3 are also listed here as other techniques.

An increase in the storage capacity of a power storage device is desired accompanying an increase in the energy consumption of the vehicle load. In view of this, it is conceivable to increase the capacity of the power storage device by connecting cells in parallel to each other. For example, a plurality of cell groups may be adopted. The cell groups each include a plurality of cells that are connected in parallel to each other. Moreover, these plurality of cell groups are connected in series to each other. Accordingly, the capacitor of the power storage device can be increased.

Incidentally, the resistance value of an internal resistance of the cell increases due to aging. In the cell groups including such cells (also referred to as "deteriorated cell group" hereinafter), the charge current decreases. Thus, such cell groups are not easily charged compared to the other cell groups. Therefore, the voltage of any deteriorated cell group may be lower than the voltage of the other cell groups immediately after the charging has ended. In this case, electric current flows from the other cell groups to the deteriorated cell group.

Also, the discharge current flowing from the deteriorated cell group having a large internal resistance to the vehicle load is smaller than the discharge current of the other cell groups having a smaller internal resistance. Thus, the voltage of the deteriorated cell group may be larger than the voltage of the other cell groups immediately after discharge has ended. In this case, electric current flows from the deteriorated cell group to the other cell groups.

If such an electric current flows between the cell groups, this electric current causes losses due to the internal resistance of the cell groups. Thus, such electric current generation is undesirable. That is, charge movement between a plurality of cell groups is undesirable.

In view of this, an object of the present invention is to provide a power supply device for a vehicle in which charge movement between a plurality of cell groups can be suppressed.

SUMMARY

An in-vehicle power supply device is to be installed in a vehicle, and includes a plurality of wiring paths, a plurality of cell groups, a plurality of switches, a deterioration diagnosis unit, a switch controller, a voltage detection unit, and an electric current detection unit. The plurality of wiring paths are connected in parallel to each other. The plurality of cell groups each include a plurality of cells that are connected in series to each other, and the plurality of cell groups are each provided on one of the plurality of wiring paths. The plurality of switches are connected in series to the plurality of cell groups in the plurality of wiring paths. The deterioration diagnosis unit specifies, from the plurality of cell groups, a deteriorated cell group that has deteriorated. The switch controller turns off, among the plurality of switches, a deterioration switch that is connected to the deteriorated cell group. The voltage detection unit detects a terminal voltage that is applied between both ends of each of the plurality of cell groups. The electric current detection unit detects an electric current that flows through each of the plurality of cell groups. The deterioration diagnosis unit calculates a resistance value of an internal resistance of each of the plurality of cell groups based on the terminal voltage, the electric current, and an open-circuit voltage of each of the plurality of cell groups, and specifies, from the plurality of cell groups, any cell group whose resistance value is larger than a resistance reference value, as a deteriorated cell group.

According to an in-vehicle power supply device, it is possible to suppress charge movement between cell groups.

BRIEF DESCRIPTION OF DRAWINGS

FIG. 5 is a diagram that schematically shows an example of the configuration of a cell group.

DETAILED DESCRIPTION OF PREFERRED EMBODIMENTS

First Embodiment

Figure 1:
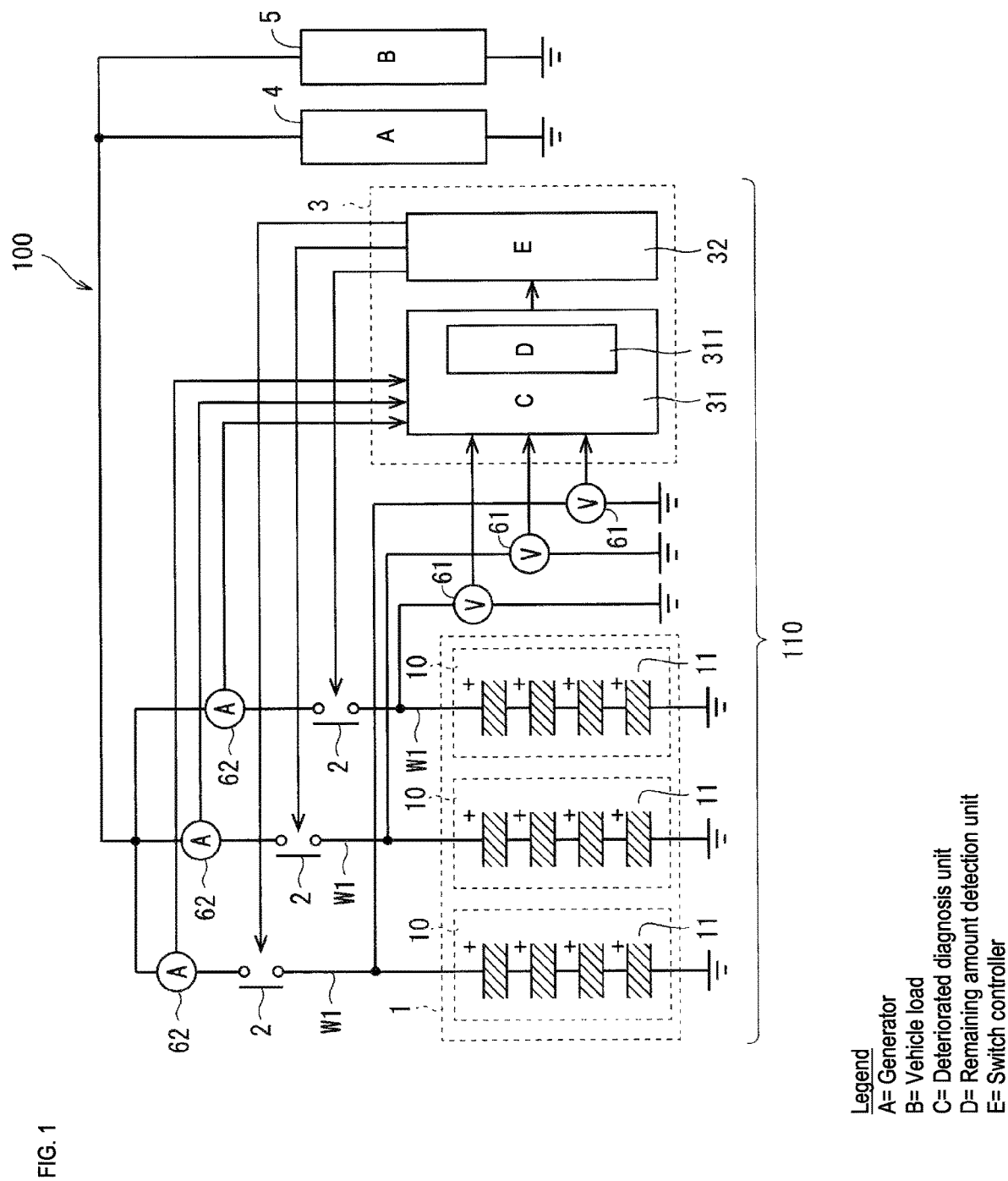
FIG. 1 is a diagram that schematically shows an example of the configuration of an in-vehicle power supply system.

FIG. 1 is a diagram that schematically shows an example of the configuration of an in-vehicle power supply system 100. This in-vehicle power supply system is installed in a vehicle. As shown in FIG. 1, the in-vehicle power supply system 100 includes an in-vehicle power supply device 110, a generator 4, and a vehicle load 5. The in-vehicle power supply device 110 includes a power storage device 1, a plurality of switches 2, and a controller 3. The power storage device 1 is a storage battery (for example, lead storage battery), for example, and has a plurality of cell groups 10. The plurality of cell groups 10 each include a plurality of cells 11. The cells 11 constitute the minimum units of a battery. In each cell group 10, the plurality of cells 11 are connected in series to each other. Although four cells 11 are shown in each cell group 10 in the example shown in FIG. 1, the number of cells 11 can be changed as appropriate.

The switches 2 are relays, for example, and are provided in correspondence with the cell groups 10. The switches 2 are connected in series to the corresponding cell groups 10. Also, serial connections of the switches 2 and the cell groups 10 are connected in parallel to each other. Note that this connection relationship can also be described as follows. That is, a plurality of wiring paths W1 that are connected in parallel to each other are provided and the plurality of cell groups 10 are each provided on one of the plurality of wiring paths W1, and the plurality of switches 2 are connected in series to the plurality of cell groups 10 in the plurality of wiring paths W1. Although three cell groups 10 are shown in the example of FIG. 1, the number of cell groups 10 can be changed as appropriate.

The cell groups 10 are connected to the generator 4 via the switches 2, for example. The generator 4 is an alternator, for example, generates power based on the rotation of an engine (not shown), and outputs a direct voltage. When the generator 4 generates power and the switches 2 are turned on, charge electric current flows from the generator 4 to the cell groups 10. That is, the power storage device 1 can be charged using the generator 4.

Also, the cell groups 10 are connected to the vehicle load 5 via the switches 2. The vehicle load 5 is an in-vehicle ECU (electronic control unit), for example. Although one vehicle load 5 is shown in the example of FIG. 1, a plurality of types of vehicle loads 5 may also be provided. When the voltage applied between both ends of the cell groups 10 (also referred to as "terminal voltage" hereinafter) is higher than the voltage of the generator 4 and the switches 2 are turned on, electric current flows from the cell groups 10 to the vehicle load 5. That is, the power storage device 1 can supply power to the vehicle load 5.

The controller 3 includes a deterioration diagnosis unit 31 and a switch controller 32. Note that the controller 3 is constituted including a microcomputer and a storage device, for example. The microcomputer executes processing steps (in other words, procedures) written in programs. The storage device can be configured by one or more of various storage devices such as a ROM (read only memory), a RAM (random access memory), a rewritable non-volatile memory (e.g., an EPROM (erasable programmable ROM)), and a hard disk device. This storage device stores various types of information, data, and the like, stores programs executed by the microcomputer, or provides a work area for program execution.

Also, the microcomputer can also be understood as functioning as various means corresponding to processing steps written in a program, or understood as realizing various functions corresponding to the processing steps. Also, the controller 3 is not limited to this, and some or all of various procedures executed by the controller 3 or various means or functions that are realized by the same may also be realized by hardware.

The deterioration diagnosis unit 31 specifies a deteriorated cell group 10 from the plurality of cell groups 10. In other words, when a cell group 10 has deteriorated, its deterioration is detected. For example, when the resistance value of the internal resistance of a cell group 10 is obtained and the resistance value is larger than a predetermined resistance reference value, deterioration of that cell group 10 is detected.

Figure 2:
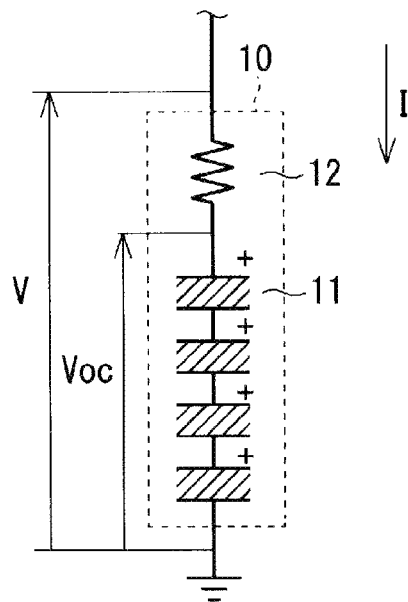
FIG. 2 is a diagram that schematically shows an example of the configuration of a cell group.

The resistance value of the internal resistance of the cell group 10 can be obtained as described below. FIG. 2 is a diagram that schematically shows an example of the internal configuration of the cell group 10. In the example shown in FIG. 2, the internal resistance 12 is also shown equivalently. A resistance value R of this internal resistance 12 is expressed using the following equation, a terminal voltage V of the cell group 10, an electric current I flowing through the cell group 10, and an open-circuit voltage Voc of the cell group 10. Note that the electric current I is positive or negative depending on whether the cell group 10 is charged or discharged. For example, the electric current I flowing to the cell group 10 has a positive value.

$$R=|V-Voc|/|I| \qquad (1)$$

That is, if the terminal voltage V, the electric current I, and the open-circuit voltage Voc can be acquired, the resistance value R can be calculated based on Equation (1). In the example shown in FIG. 1, voltage detection units 61 and electric current detection units 62 are provided. The voltage detection units 61 detect the terminal voltage V of the cell groups 10, and output the detected voltage to the deterioration diagnosis unit 31. The electric current detection units 62 detect the electric current I of the cell groups 10, and output the detected electric current to the deterioration diagnosis unit 31.

In the example shown in FIG. 1, the deterioration diagnosis unit 31 has a remaining amount detection unit 311. The remaining amount detection unit 311 detects a remaining amount of power (for example, state of charge) SOC stored in each cell group 10. For example, the remaining amount detection unit 311 adds up the incoming and outgoing electric current I, and calculates the remaining amount of power SOC stored in the cell groups 10 based on the value of this integration. Note that the adding up of the incoming and outgoing electric current I is an integration of the electric current I where the electric current I flowing to the cell group 10 is taken to be positive and the electric current I flowing out from the cell group 10 is taken to be negative, for example.

The deterioration diagnosis unit 31 then obtains the open-circuit voltage Voc of each cell group 10 based on the remaining amount of power SOC stored in the cell group 10. A relationship between the remaining amount of stored power SOC and the open-circuit voltage Voc may be measured through a preliminary experiment or simulation, for example, and stored in a storage unit or the like. Use of this relationship makes it possible to obtain the open-circuit voltage Voc based on the remaining amount of stored power SOC.

As described above, it is possible to acquire the terminal voltage V, the electric current I, and the open-circuit voltage Voc. The deterioration diagnosis unit 31 obtains the resistance value R of the internal resistance 12 of each cell group 10 using these open-circuit voltage Voc, electric current I, terminal voltage V, and Equation (1).

The deterioration diagnosis unit 31 determines whether or not the calculated resistance value R is larger than the resistance reference value Rref. The resistance reference value Rref may be set in advance and stored in a storage unit, for example. If the deterioration diagnosis unit 31 determines that the resistance value R of a cell group 10 is larger than the resistance reference value Rref, the deterioration diagnosis unit 31 determines that the cell group 10 has deteriorated. The deterioration diagnosis unit 31 performs this determination on all of the cell groups 10 and outputs the determination results to the switch controller 32. Hereinafter, cell groups 10 that are determined to have deteriorated are also referred to as "deteriorated cell groups 10", and cell groups 10 that are not determined to have deteriorated are also referred to as "normal cell groups 10".

The switch controller 32 turns the switches 2 on/off. For example, if no cell group 10 has deteriorated, the switch controller 32 turns on all of the switches 2. On the other hand, if the deterioration diagnosis unit 31 determines that a cell group has deteriorated, the switch controller 32 turns off the switch 2 that is connected to the deteriorated cell group 10. Hereinafter, switches 2 that are connected to the deteriorated cell group 10 are also referred to as "deteriorated switches 2", and switches 2 that are connected to the normal cell group 10 are also referred to as "normal switches 2".

As described above, in the present embodiment, the deteriorated switch 2 is turned off for the deteriorated cell group 10. Thus, the connection between this deteriorated cell group 10 and the other normal cell groups 10 is interrupted. Therefore, it is possible to prevent charge movement between the deteriorated cell group 10 and the other normal cell groups 10. Accordingly, it is possible to avoid an unnecessary loss.

In the First Embodiment, the deteriorated cell group 10 is separated from the others when the resistance value R of the internal resistance 12 has increased. Incidentally, even though the resistance value R of the internal resistance 12 increases, the deteriorated cell group 10 is not necessarily unusable. That is, even though the deteriorated cell group 10 can be still utilized in the First Embodiment, such a deteriorated cell group 10 is separated from the normal cell groups 10 in order to avoid charge movements caused by the connection between the deteriorated cell group 10 and the normal cell groups 10. This is significantly different from the technical idea of separating a cell group 10 due to the occurrence of an abnormality that makes the cell group 10 unusable.

Figure 3:
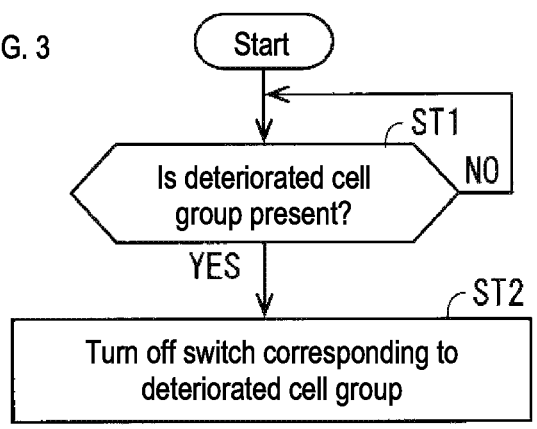
FIG. 3 is a flowchart showing an example of operation of a controller.

FIG. 3 is a flowchart showing an example of the above-described operation of the controller 3. First, in step ST1, the deterioration diagnosis unit 31 determines whether or not there is a deteriorated cell group 10. For example, it is determined, for each cell group 10, whether or not the resistance value R of the internal resistance 12 exceeds the resistance reference value Rref. If it is determined that there is no deteriorated cell group 10, then the controller 3 executes step ST1 again. On the other hand, if it is determined that there is a deteriorated cell group 10, then the switch controller 32 turns off the deteriorated switch 2 corresponding to the deteriorated cell group 10, in step ST2.

Second Embodiment

Figure 4:
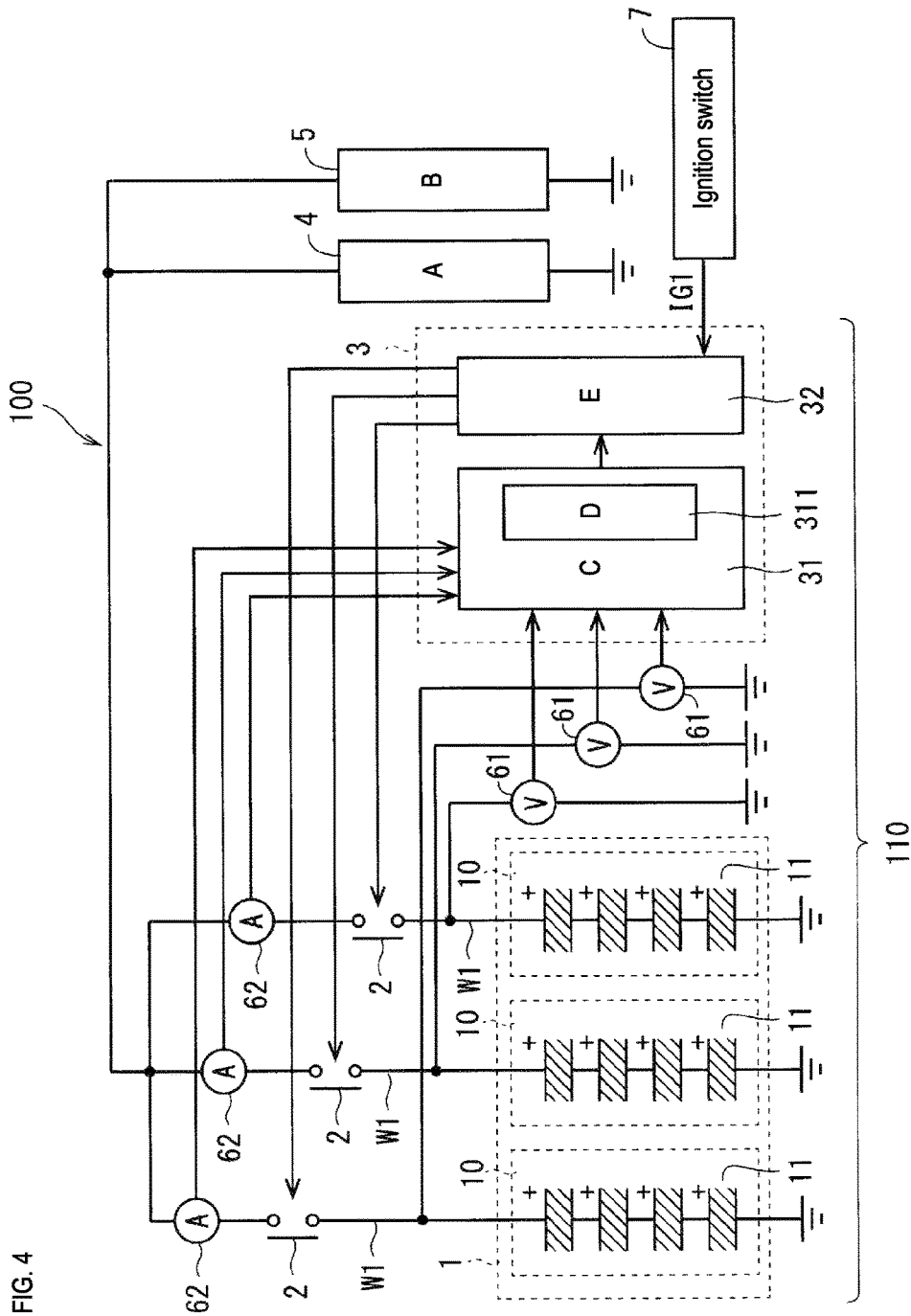
FIG. 4 is a diagram that schematically shows an example of the configuration of the in-vehicle power supply system.

FIG. 4 is a diagram that schematically shows an example of the configuration of an in-vehicle power supply system 100. Compared to the First Embodiment, the in-vehicle power supply system 100 is further provided with an ignition switch 7 for switching the ignition of a vehicle in which this in-vehicle power supply system 100 is installed on and off. A signal IG1 indicating the on/off state of the ignition switch 7 is input to the switch controller 32. When the ignition switch 7 is turned on through a user operation, the switch controller 32 turns on the switch 2 as appropriate and supplies power from the power storage device 1 to the vehicle load 5 as appropriate, for example.

Note that herein, a plurality of the vehicle loads 5 are provided, and even when the ignition switch 7 is in the off state, there are vehicle loads 5 to which power is supplied from the power storage device 1. In this manner, examples of the vehicle loads 5 to which power is supplied in a state in which the ignition switch 7 is turned off include a security apparatus and a remotely controlled door lock. In order for the power storage device 1 to select supplying of power or stopping of power supply individually for various types of vehicle load 5, switches (relays) may also be provided between the power storage device 1 and the vehicle loads 5.

When the ignition switch 7 is in the on state, the switch controller 32 controls the switches 2 as described in the First Embodiment. That is, when there is no deteriorated cell group 10, the switch controller 32 turns on all of the switches 2, and when there is a deteriorated cell group 10, the switch controller 32 turns off the deteriorated switch 2 corresponding to the deteriorated cell group 10.

On the other hand, when the ignition switch 7 is in the off state, the switches 2 are controlled as follows: that is, the switch controller 32 turns on the deteriorated switch 2 and turns off the normal switches 2 when the ignition switch 7 is in the off state and the remaining amount of power SOC stored in the deteriorated cell group 10 is larger than the remaining amount reference value. Accordingly, the deteriorated cell group 10 supplies power to the vehicle loads 5.

As described in the First Embodiment, the deteriorated cell group 10 is separated from the system in a time period during which the ignition switch 7 is in the on state as described above, whereas when a sufficient power is stored in the deteriorated cell group 10, power is supplied to the vehicle loads 5 using this power in a time period during which the ignition switch 7 is in the off state. In other words, the power stored in the deteriorated cell group 10 is utilized for dark electric current. Accordingly, the power stored in the deteriorated cell group 10 can be effectively utilized.

Also, the switch controller 32 turns off the deteriorated switch 2 and turns on the normal switches 2 when the ignition switch 7 is in the off state and the remaining amount of power SOC stored in the deteriorated cell group 10 is smaller than the remaining amount reference value. That is, if power that is sufficient to be supplied to the vehicle loads 5 does not remain in the deteriorated cell group 10, the normal cell groups 10 supply power to the vehicle loads 5. Accordingly, even though the deteriorated cell group 10 has an insufficient power, power can be sufficiently supplied to the vehicle loads 5.

FIG. 5 is a flowchart showing an example of the above-described operation executed by the controller 3. In step ST10, the deterioration diagnosis unit 31 determines whether or not there is a deteriorated cell group 10. If it is determined that there is no deteriorated cell group, step ST10 is executed again. Next, the switch controller 32 determines whether or not the ignition switch 7 is in the off state. If it is determined that the ignition switch 7 is in the on state, the switch controller 32 turns on the normal switches 2 and turns off the deteriorated switch 2 in step ST14. This operation is substantially similar to that in the First Embodiment.

In step ST11, if it is determined that the ignition switch 7 is in the off state, the switch controller 32 determines in step ST12 whether or not the remaining amount of power SOC stored in the deteriorated cell group 10 is larger than the remaining amount reference value. The remaining amount reference value may be set in advance and stored in a storage unit, for example. If it is determined that the remaining amount of stored power SOC is larger than the remaining amount reference value, the switch controller 32 turns on the deteriorated switch 2 and turns off the normal switches 2 in step ST13. Accordingly, the deteriorated cell group 10 supplies dark electric current.

In step ST12, if it is determined that the remaining amount of stored power SOC is smaller than the remaining amount reference value, the switch controller 32 turns on the normal switches 2 and turns off the deteriorated switch 2 in step ST14. Accordingly, the normal cell groups 10 supply dark electric current.

The configurations described in the above-described embodiments and modifications can be used in combination as appropriate as long as they are consistent with each other.

Although this invention has been described in detail above, the above description is illustrative in all respects, and this invention is not limited to the above description. It will be understood that numerous modifications not illustrated here can be envisioned without departing from the scope of this invention.

The invention claimed is:

1. An in-vehicle power supply device to be installed in a vehicle, comprising:
  a plurality of wiring paths connected in parallel to each other;
  a plurality of cell groups that each include a plurality of cells connected in series to each other and are each provided on one of the plurality of wiring paths;
  a plurality of switches that are connected in series to the plurality of cell groups in the plurality of wiring paths;
  a deterioration diagnosis unit configured to specify, from the plurality of cell groups, a deteriorated cell group that has deteriorated;
  a switch controller configured to turn off, among the plurality of switches, a deteriorated switch that is connected to the deteriorated cell group;
  a voltage detection unit configured to detect a terminal voltage that is applied between both ends of each of the plurality of cell groups; and
  an electric current detection unit configured to detect an electric current that flows through each of the plurality of cell groups,
  wherein the deterioration diagnosis unit:
    calculates a resistance value of an internal resistance of each of the plurality of cell groups based on the terminal voltage, the electric current, and an open-circuit voltage of each of the plurality of cell groups, and
    specifies, from the plurality of cell groups, any cell group whose resistance value is larger than a resistance reference value, as a deteriorated cell group; and
  a remaining amount detection unit configured to detect a remaining amount of power stored in each of the plurality of cell groups,
  wherein the switch controller turns off a normal switch, which is a switch of the plurality of switches other than the deteriorated switch, and turns on the deteriorated switch when an ignition of the vehicle is turned off and the remaining amount of the stored power is larger than a remaining amount reference value.

2. The in-vehicle power supply device according to claim 1, wherein the open-circuit voltage of each of the plurality of cell groups is obtained based on a remaining amount of power stored in the corresponding cell group.

3. The in-vehicle power supply device according to claim 2, further comprising:
  a remaining amount detection unit configured to detect the remaining amount of the stored power,
  wherein the switch controller turns off a normal switch, which is a switch of the plurality of switches other than the deteriorated switch, and turns on the deteriorated switch when an ignition of the vehicle is turned off and the remaining amount of the stored power is larger than a remaining amount reference value.

4. The in-vehicle power supply device according to claim 1, wherein the switch controller turns on the normal switch, and turns off the deteriorated switch when the ignition is turned off and the remaining amount of the stored power is smaller than the remaining amount reference value.

5. The in-vehicle power supply device according to claim 2, further comprising:
  a remaining amount detection unit configured to detect a remaining amount of power stored in each of the plurality of cell groups,
  wherein the switch controller turns off a normal switch, which is a switch of the plurality of switches other than the deteriorated switch, and turns on the deteriorated switch when an ignition of the vehicle is turned off and the remaining amount of the stored power is larger than a remaining amount reference value.

6. The in-vehicle power supply device according to claim 3, wherein the switch controller turns on the normal switch, and turns off the deteriorated switch when the ignition is turned off and the remaining amount of the stored power is smaller than the remaining amount reference value.

* * * * *